United States Patent
Moon et al.

(10) Patent No.: US 7,537,975 B2
(45) Date of Patent: May 26, 2009

(54) ORGANIC THIN FILM TRANSISTOR AND METHOD OF FABRICATING THE SAME

(75) Inventors: Hee-Sung Moon, Suwon-si (KR); Jae-Myung Kim, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 204 days.

(21) Appl. No.: 11/408,544

(22) Filed: Apr. 21, 2006

(65) Prior Publication Data

US 2006/0240605 A1 Oct. 26, 2006

(30) Foreign Application Priority Data

Apr. 22, 2005 (KR) .................. 10-2005-0033663

(51) Int. Cl.
*H01L 21/00* (2006.01)

(52) U.S. Cl. .............. 438/149; 257/E29.151; 977/742

(58) Field of Classification Search ......... 438/149–167; 977/721, 742, 749–753
See application file for complete search history.

(56) References Cited

U.S. PATENT DOCUMENTS 6,440,761 B1 * 8/2002 Choi ......................... 438/20
2004/0245527 A1 * 12/2004 Tsukagoshi et al. ........... 257/77
2005/0056828 A1 * 3/2005 Wada et al. .................. 257/40
2006/0118777 A1 * 6/2006 Hirakata et al. .............. 257/39
2006/0172219 A1 * 8/2006 Stasiak et al. ............... 430/117

FOREIGN PATENT DOCUMENTS

| JP | 2003-096313 | 4/2003 |
| JP | 2004-266272 | 9/2004 |
| KR | 10-2004-0072067 A | 8/2004 |
| KR | 10-2005-0011124 | 1/2005 |
| WO | 2005/008784 A1 | 1/2005 |

OTHER PUBLICATIONS

Notice of Allowance issued Aug. 21, 2007 in counterpart Korean patent application No. 10-2005-0033663 in 1 page.
Japanese Patent Office Notification of Offer of Information issued on Dec. 25, 2007 in 1 page.
Offer of Information in corresponding Japanese patent application No. 2006-116920 in 9 pages.
Carbon Nanotubes—Expected Material Development.

* cited by examiner

*Primary Examiner*—Brook Kebede
(74) *Attorney, Agent, or Firm*—Knobbe Martens Olson & Bear LLP

(57) ABSTRACT

An organic thin film transistor (TFT) and a method of fabricating the same are provided. In the method, an organic semiconductor layer is formed by mixing carbon nanotubes with an organic semiconductor material or coating the organic semiconductor material on a carbon nanotube layer. The resulting organic semiconductor layer has enhanced charge mobility and switching speed owing to the carbon nanotubes' high electric conductivity and charge mobility.

32 Claims, 2 Drawing Sheets

ORGANIC THIN FILM TRANSISTOR AND METHOD OF FABRICATING THE SAME

CROSS-REFERENCE TO RELATED APPLICATIONS

This application claims priority to and the benefit of Korean Patent Application No. 10-2005-0033663, filed Apr. on 22, 2005, the disclosure of which is incorporated herein by reference in its entirety.

BACKGROUND OF THE INVENTION

1. Field of the Invention

The present invention relates to an organic thin film transistor (TFT) and a method of fabricating the same, and more particularly, to an organic TFT and a method of fabricating the same in which an organic semiconductor layer includes carbon nanotubes (CNTs) and an organic semiconductor material and provides enhanced charge mobility and switching speed.

2. Description of the Related Technology

Over the past 10 years, laborious research into materials and applications of organic thin film transistor (TFTs) has accompanied the development of low-cost electronic devices. In particular, an organic TFT disposed on a substrate far less to fabricate than an inorganic TFT. An organic TFT may go well with a low-temperature process and a flexible electronic device (e.g., a flexible flat panel display (FPD)). Above all, the organic TFT is highly applicable to flexible FPDs such as a flexible liquid crystal display (LCD) and a flexible organic light emitting display (OLED).

Recently, an organic thin layer having a pentacene structure has been used for organic TFTs. In the early stages of development, the pentacene organic thin layer was an organic semiconductor layer having a charge mobility of $9 \times 10^{-3}$ cm$^2$/V·sec and an on/off ratio of $1 \times 10^5$. Recently, it has been reported that a pentacene organic thin layer has a charge mobility of 2.1 to 3.3 cm$^2$/V·sec and an on/off ratio of $2 \times 10^7$ to $1 \times 10^9$ which are about the same as those of an amorphous silicon (a-Si:H) TFT. The term, "on/off ratio," as used herein, refers to a ratio of current-on to current-off in a pixel of an active matrix (AM)-type display device. The on/off ratio greatly affects the operations of pixels of a display device.

Carbon nanotubes (CNTs) have a low work function and exhibit a high electric field concentration effect because of its high aspect ratio. Thus, they have excellent electron-emitting characteristics. For this reason, extensive research has been conducted for the use of CNTs in field emission display devices. Recently, CNTs have been studied with the aim of using them in various devices such as semiconductor devices, fuel batteries, secondary batteries, compound materials, and capacitors.

As disclosed in Korean Patent Laid-Open Publication No. 2004-0072067, a solution of a pentacene derivative is obtained by causing a Diels-Alder reaction between pentacene and dienophile in an organic solvent. The solution of the pentacene derivative is pyrolyzed by heating the solution from room temperature to 200° C. Then, a pentacene thin layer is formed using a thermal evaporation process or a solution-based process such as a spin coating process, an ink-jet printing process, or a screen printing process.

Also, CNTs are reduced to powder through an arc-discharge process, a laser vaporization process, a plasma-enhanced chemical vapor deposition (PECVD) process, a thermal chemical vapor deposition (thermal CVD), a vapor phase growth process, an electrolysis process, or a flame synthesis process.

There are two main types of carbon nanotubes (CNTs): single-walled nanotubes and multi-walled nanotubes, based on the number of walls which constitute CNTs. In addition, CNTs may be a rope-type which is obtained by lumping single-walled nanotubes into several ropes. The classifications used herein are the same as those known in the industry.

In using CNTs for emission devices, CNT powder is first mixed with a paste, and then deposited on a substrate to form a CNT layer, using a spin coating process, an ink-jet printing process, or a screen printing process. Subsequently, the CNT layer is sintered so as to be cured.

The organic TFT is advantageously used in electronic paper and flexible FPDs, owing to its low fabrication cost. However, because the organic TFT is far inferior to a polycrystalline silicon (poly-Si) TFT in terms of charge mobility and switching speed, it cannot be easily applied to voltage-drive FPDs that require high charge mobility and switching speed.

SUMMARY OF CERTAIN INVENTIVE ASPECTS

One aspect of the invention provides an electronic device. The electronic device comprises: a substrate; and a thin film transistor formed over the substrate, the thin film transistor comprising a channel, a gate electrode, an insulating layer, a source, and a drain, the insulating layer being interposed between the channel and the gate electrode, wherein the channel comprises carbon nanotubes and an organic semiconductor material.

In the device, the electronic device may comprise a display device. The carbon nanotubes and the organic semiconductor material may be substantially homogeneously distributed throughout the channel. The carbon nanotubes and the organic semiconductor material may be non-homogeneously distributed within the channel.

The channel may comprise a first layer comprising the carbon nanotubes, and a second layer comprising the organic semiconductor material. The second layer may be interposed between the first layer and the insulating layer. The first layer may be interposed between the second layer and the insulating layer. The first layer may further comprise the organic semiconductor material. The second layer may be substantially free of the carbon nanotubes. The second layer may be thinner than about a half of the thickness of the first layer. The first layer may be thinner than about a half of the thickness of the second layer. The first layer may have a thickness of less than about 5 µm.

The channel may further comprise one or more materials selected from the group consisting of Au, Pt, Si, Ag, Fe, Ni, Co, and alloys comprising one or more of the foregoing elements. At least part of the carbon nanotubes may be coated with one or more materials selected from the group consisting of Au, Pt, Si, Ag, Fe, Ni, Co, and alloys comprising one or more of the foregoing elements. The carbon nanotubes may comprise at least one form selected from the group consisting of single-walled carbon nanotubes, multi-walled carbon nanotubes, and rope nanotubes. The carbon nanotubes may comprise at least one structure selected from the group consisting of a zigzag structure, an armchair structure, and a chiral structure. The carbon nanotubes may have a diameter about 200 nm or less. The organic semiconductor material may comprise one or more compounds selected from the group consisting of pentacene, oligo-thiophene, poly(alkylthiophene), and poly(thienylenevinylene).

The gate electrode may be interposed between the insulating layer and the substrate, and a first portion of the insulating layer may be interposed between the substrate and the source. In addition, a second portion of the insulating layer may be interposed between the substrate and the drain, and a third portion of the insulating layer may be interposed between the gate electrode and the channel. Both the source and the drain may contact the channel.

The channel may have a charge mobility of greater than 3.3 $cm^2/V\cdot sec$. The channel may have an on/off ratio of greater than $1\times10^9$.

Another aspect of the invention provides a method of making an electronic device. The method comprises: providing a substrate; and forming a thin film transistor over the substrate, the thin film transistor comprising a channel, a gate electrode, an insulating layer, a source, and a drain, the insulating layer being interposed between the channel and the gate electrode, the source and drain contacting the channel, wherein the channel may comprise carbon nanotubes and an organic semiconductor material.

In the method, the channel may further comprise one or more materials selected from the group consisting of Au, Pt, Si, Ag, Fe, Ni, Co, and alloys comprising one or more of the foregoing elements. At least part of the carbon nanotubes may be coated with one or more materials selected from the group consisting of Au, Pt, Si, Ag, Fe, Ni, Co, and alloys comprising one or more of the foregoing elements. The organic semiconductor material may comprise one or more compounds selected from the group consisting of pentacene, oligothiophene, poly(alkyl-thiophene), and poly(thienylenevinylene).

Forming the thin film transistor may comprise: forming the channel, which may comprise forming a first layer and a second layer, wherein the first layer may comprise the carbon nanotubes, and wherein the second layer may comprise the organic semiconductor material and may be substantially free of the carbon nanotubes. Forming the thin film transistor may comprise forming the channel, and forming the channel may comprise using one process selected from the group consisting of spin coating, ink-jet printing, and screen printing. Forming the channel may further comprise sintering at a temperature about 300° C. or lower. Forming the second layer may comprise using a method selected from the group consisting of vacuum deposition and organic vapor deposition. Forming the second layer may be at least partially performed in a vacuum atmosphere of $5\times10^{-4}$ Torr or less.

Yet another aspect of the invention provides a method of operating an electronic device. The method comprises: providing the electronic device described above; and stimulating the electronic device to activate the channel of the thin film transistor, wherein the channel has a charge mobility of greater than 3.3 $cm^2/V\cdot sec$ during the activation. The channel may have an on/off ratio of greater than $1\times10^9$ during the activation.

Another aspect of the present invention provides an organic thin film transistor (TFT) and a method of fabricating the same in which an organic semiconductor layer is formed by mixing CNTs with an organic semiconductor material or coating the organic semiconductor material on a CNT layer, with the result that properties of the organic semiconductor layer such as charge mobility and switching speed can be improved owing to the CNTs' high electric conductivity and charge mobility.

The organic TFT includes: a substrate; a gate electrode disposed on the substrate; a gate insulating layer disposed on the gate electrode; source and drain disposed on the gate insulating layer; and an organic semiconductor layer disposed on the source and drain and formed of two kinds of materials.

Yet another aspect of the invention provides a method of fabricating an organic TFT. The method includes: providing a substrate; forming a gate electrode on the substrate; forming a gate insulating layer on the gate electrode; forming source and drain on the gate insulating layer; forming an organic layer on the source and drain, the organic layer being a mixture of carbon nanotubes and an organic semiconductor material; and sintering the organic layer to form an organic semiconductor layer.

Yet another aspect of the invention provides a method of fabricating an organic TFT includes. The method comprises providing a substrate; forming a gate electrode on the substrate; forming a gate insulating layer on the gate electrode; forming source and drain on the gate insulating layer; forming a carbon nanotube layer on the source and drain; and coating an organic semiconductor material on the carbon nanotube layer to form an organic semiconductor layer.

BRIEF DESCRIPTION OF THE DRAWINGS

The above and other features of the present invention will be described in reference to certain exemplary embodiments thereof with reference to the attached drawings in which.

DETAILED DESCRIPTION OF CERTAIN INVENTIVE EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein.

Figure 1A:
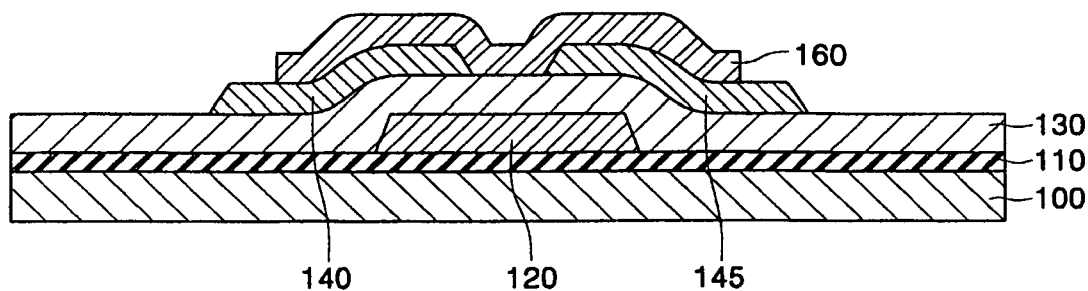
FIG. 1A is a cross-sectional view of a bottom-contact-type organic thin film transistor (TFT) according to an embodiment of the invention.
Figure 1B:
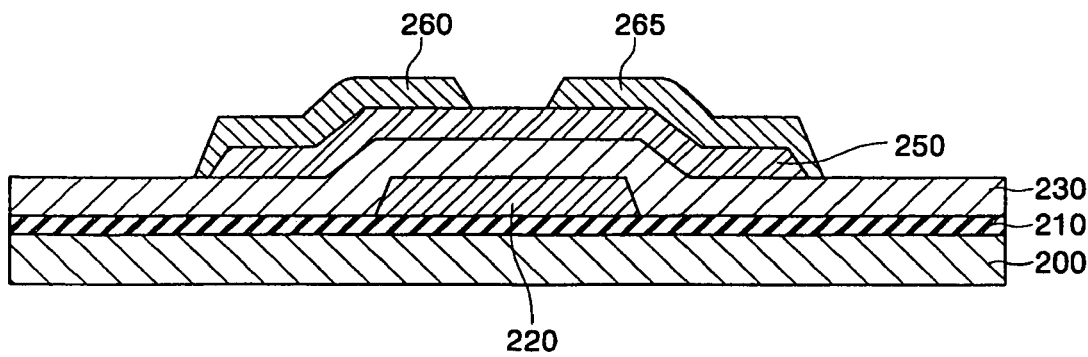
FIG. 1B is a cross-sectional view of a top-contact-type organic TFT according to another embodiment of the invention.

FIG. 1A is a cross-sectional view of a bottom-contact-type organic thin film transistor (TFT) according to one embodiment, and FIG. 1B is a cross-sectional view of a top-contact-type organic TFT according to another embodiment. The term, "organic thin film transistor," as used herein, refers to a thin film transistor having a channel or semiconductor layer which includes an organic semiconductor material. An organic thin film transistor may have a conventional TFT structure or a modified structure such as a bottom-contact-type or a top-contact-type, as shown in FIGS. 1A and 1B, respectively. The conventional TFT structure refers to a TFT structure having a semiconductor layer overlying a substrate, a gate insulating layer, a gate electrode, and source and drain contacting the semiconductor layer.

In FIGS. 1A and 1B, the organic TFT includes an organic semiconductor layer formed of a mixture of carbon nanotubes (CNTs) and an organic semiconductor material. The mixture of the CNTs and the organic semiconductor material may be a substantially homogeneous mixture. In certain embodiments, however, the mixture of the CNTs and the organic semiconductor material may be a non-homogeneous mixture.

Referring to FIG. 1A, a substrate 100 is provided. In one embodiment, the substrate 100 may be formed of one or more materials selected from metal, silicon, glass, plastic, sapphire, quartz, insulator, or stainless steel.

A buffer layer 110 is formed on the substrate 100. The buffer layer 110 is formed by depositing silicon oxide or silicon nitride using a chemical vapor deposition (CVD) process, such as a plasma-enhanced CVD (PECVD) process or a low-pressure CVD (LPCVD) process. In the illustrated embodiment, the buffer layer 110 may be a single layer formed of silicon oxide or silicon nitride, or a double layer having a silicon oxide layer and a silicon nitride layer. The buffer layer 110 is configured to prevent diffusion of moisture or impurities generated in the substrate 100. The buffer layer 110 also prevents an organic semiconductor structure from being separated from the substrate 100 after a subsequent sintering process. In certain embodiments, the buffer layer 110 may be omitted.

Next, a material for a gate electrode is deposited on the buffer layer 110 and patterned using a shadow mask or an ink-jet process, thereby forming a gate electrode 120. The gate electrode 120 may be formed of one metal selected from Au, Pt, Cr, Mo, Ni, Al, and alloys thereof. Alternatively, the gate electrode 120 may be formed of one or more inorganic materials selected from polysilicon (poly-Si), amorphous silicon (a-Si), indium tin oxide (ITO), indium zinc oxide (IZO), and $In_2O_3$. Alternatively, the gate electrode 120 may be formed of two or more of the above-mentioned materials. When the gate electrode 120 is formed of a metal, it may be formed by a vacuum deposition process, a mask layer forming process, or a photolithographic process.

When a gate electrode of a p-type semiconductor device is formed of a metal, the gate electrode 120 may be formed of a material having a low work function, such as Al, AlNd, or MoW. On the other hand, when a gate electrode of an n-type semiconductor device is formed of a metal, the gate electrode 120 may be formed of a material having a high work function, such as Au or Pt.

In certain embodiments, the gate electrode 120 may be formed of an organic material, such as poly-aniline or polythiophene, or formed by coating a conductive ink. When the gate electrode 120 is formed of such an organic material, it may be formed by a spin coating process, a casting process, a pull-up process, a transfer process, or an ink-jet process.

Subsequently, a gate insulating layer 130 is formed on the gate electrode 120. In this case, the gate insulating layer 130 may be a silicon oxide layer, a silicon nitride layer, or a double layer including a silicon oxide layer and a silicon nitride layer. In addition, the gate insulating layer 130 may be formed of one or more materials selected from the group consisting of high-k dielectric materials such as BST($Ba_xSr_{1-x}TiO_3$), PZT ($PbZr_xTi_{1-x}O_3$), $TiO_2$ and $Al_2O_3$, $Y_2O_3$, $ZnO_2$, $HfO_2$, $ZrO_2$, and $Ta_2O_5$ in order to lower a threshold voltage. Alternatively, the gate insulating layer 130 may be formed of one or more organic materials selected from the group consisting of parylene (which is an abbreviated form of poly(para-xylylene)), polychloropyrene, polyethylene terephthalate (PET), polyoxymethylene, polyvinylchloride, polyfluorovinyliden (PVDF), cyanoethyl pullulan, polymethylmetaacrylate (PMMA), polysulfone, polycarbonate (PC), and polyimide. The gate insulating layer 130 may be formed by PECVD or LPCVD.

Thereafter, source and drain 140 and 145 are formed on the gate insulating layer 130. The source and drain 140 and 145 may be formed of one or more materials selected from the group consisting of Au, Pt, Cr, Mo, Ni, Al, and alloys thereof. For a p-type semiconductor device, the source and drain 140 and 145 may be formed of a material having a high work function, such as Au and Pt. On the other hand, for an n-type semiconductor device, the source and drain 140 and 145 may be formed of a material having a low work function, such as Al, AlNd, and MoW.

The source and drain 140 and 145 may be formed using a shadow mask or an ink-jet process. In another embodiment, the source and drain 140 and 145 may be formed by depositing an electrode material and etching the electrode material using a subsequent photolithographic process.

Subsequently, an organic semiconductor layer 160 is formed on the source and drain 140 and 145 using two kinds of materials. To form the organic semiconductor layer 160, an organic layer (not shown) is first formed using a mixture of CNTs and an organic semiconductor material.

The CNTs may be single-walled CNTs (SWCNTs), multi-walled CNTs (MWCNTs), or rope-type CNTs. In one embodiment, the organic semiconductor layer 160 may have a mixture of single-walled and multi-walled CNTs. The CNTs may have a diameter of 200 nm or less in order to have good electrical characteristics. In another embodiment, the CNTs have a diameter of 20 nm to maximize their electrical characteristics.

Also, the CNTs may have one or more structures selected from a zigzag structure, an armchair structure, and a chiral structure. The CNTs may have a symmetric structure such as a zigzag structure or an armchair structure. In certain embodiments, the CNTs have a chiral structure in which honeycomb hexagons are spirally arranged along a tube axis. The CNTs may be formed using a catalyst such as Au, Pt, Si, Ag, Fe, Ni, Co, or alloys thereof. The catalyst is removed after forming the CNTs. However, the organic semiconductor layer 160 may have a residual amount of the catalyst.

In another embodiment, the channel contains CNTs that are coated with one or more materials such as Au, Pt, Si, Ag, Fe, Ni, Co, or alloys thereof. Such coated CNTs may be prepared by mixing CNTs with one or more compounds containing these elements, including certain salts of these elements. In some embodiments, substantially all the CNTs in the channel are coated with one or more of these materials. In other embodiments, only some of the CNTs in the channel are coated. Also, in embodiments, the coated CNTs are coated with the material over substantially the entire surface or only some part thereof. Optionally, prior to forming the channel, the mixture is treated with one or more reducing agents that can reduce salts of the foregoing elements.

In making use of CNTs synthesized at a temperature of 950° C., electrons are emitted from the CNTs at the greatest current density of about 14.5 mA/cm$^2$, and an electric field of about 8.2 V/μm arises at the greatest current density. However, the more asymmetrical the CNTs become, the better the characteristics of the CNTs are. Therefore, the CNTs having an asymmetrical zigzag or armchair structure provide enhanced characteristics for the organic semiconductor layer.

The organic semiconductor material may be one or more materials selected from the group consisting of pentacene, oligo-thiophene, poly(alkyl-thiophene), and poly(thienylenevinylene). In one embodiment, the organic semiconductor material is pentacene.

In one embodiment, a mixture of the CNTs and the organic semiconductor material is deposited in a paste form using a spin coating process, an ink-jet printing process, or a screen printing process, thereby forming an organic layer. Thereafter, the organic layer is sintered to form the organic semiconductor layer 160. In this case, the organic layer is sintered at a temperature of about 300° C. or lower. After the sintering process, the organic semiconductor layer 160 has a thickness of about 5 μm or less.

In the present embodiment, the organic TFT has not only a charge mobility of 3.3 cm$^2$/V·sec or higher and an on/off ratio of $1\times10^9$ or higher but also a high switching speed. These advantages are achieved because the CNTs, which have excellent electric characteristics, and the organic semiconductor material complement each other.

In the illustrated embodiment, the organic TFT includes the organic semiconductor layer 160, which is formed of a mixture of the CNTs and the organic semiconductor material. For brevity of explanation, only the bottom-contact-type organic TFT in which the organic semiconductor layer 160 is formed on the source and drain 140 and 145 is described. In certain embodiments, the organic semiconductor layer structure may apply to a conventional TFT structure described above.

In another embodiment, the organic semiconductor layer can be used for a top-contact-type organic TFT in which an organic semiconductor layer 250 is disposed under source and drain 260 and 265, as illustrated in FIG. 1B. In this case, the organic semiconductor layer 250 is interposed between a source/drain 260, 265 and a gate insulating layer 230. However, a substrate 200, a buffer layer 210, a gate electrode 220, a gate insulating layer 230, the organic semiconductor layer 250, the source 260, and the drain 265 are formed using the same material and method as those of the bottom-contact-type organic TFT of FIG. 1A.

Figure 1C:
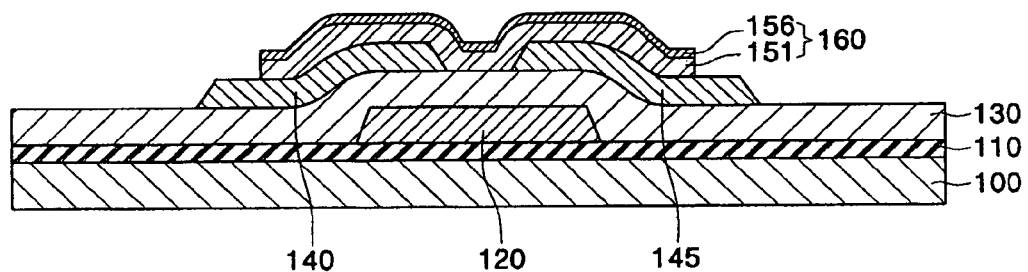
FIG. 1C is a cross-sectional view of a bottom-contact-type organic TFT according to yet another embodiment of the invention.
Figure 1D:
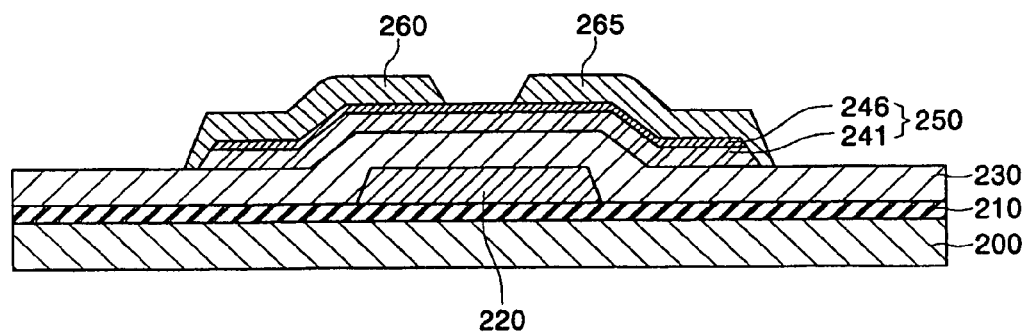
FIG. 1D is a cross-sectional view of a top-contact-type organic TFT according to yet another embodiment of the invention.

FIG. 1C is a cross-sectional view of a bottom-contact-type organic TFT according to another embodiment, and FIG. 1D is a cross-sectional view of a top-contact-type organic TFT according to yet another embodiment.

In FIGS. 1C and 1D, the organic TFT includes an organic semiconductor layer which includes a CNT layer and an organic semiconductor material layer overlying the CNT layer. In certain embodiments, the CNT layer may also contain some of the organic semiconductor material or one or more other organic materials. In a non-illustrated embodiment, the organic semiconductor material layer may underlie the CNT layer. In another embodiment, the organic semiconductor layer may have multiple layers stacked over one another. The multiple layers may have one or more CNT layers, one or more organic semiconductor material layers, and/or one or more layers including both CNTs and an organic semiconductor material. A skilled artisan will appreciate that the layer structures and thicknesses of the layers may be varied, depending on the design of a TFT.

Layers of the embodiments illustrated in FIGS. 1C and 1D are the same as those of the embodiments of FIGS. 1A and 1B, respectively, except for the structure and forming process of an organic semiconductor layer. Thus, detailed description of the other layers may be omitted below.

Referring to FIG. 1C, the bottom-contact-type organic TFT may include a buffer layer 110 disposed on a substrate 100. A material for a gate electrode is deposited on the buffer layer 110 and patterned, thereby forming a gate electrode 120. A gate insulating layer 130 is formed on the gate electrode 120. Thereafter, materials for source and drain are deposited on the gate insulating layer 130 and patterned, thereby forming source and drain 140 and 145 in a region corresponding to the gate electrode 120. The substrate 100, the buffer layer 110, the gate electrode 120, the gate insulating layer 130, and the source and drain 140 and 145 are formed using the same material and method as the bottom-contact-type organic TFT of FIG. 1A. Thereafter, an organic semiconductor layer 160 is formed on the source and drain 140 and 145 using two kinds of materials. First, a paste containing CNTs is formed on the entire surface of the source and drain 140 and 145 using a spin coating process, an ink-jet printing process, or a screen printing process.

The paste is sintered at a temperature of about 300° C. or lower. A resulting CNT layer 151 has a thickness of about 5 μm or less. Next, an organic semiconductor material 156 is coated on the CNT layer 151.

The CNT layer 151 may include the same types of nanotubes as those of the organic semiconductor layer 160 of FIG. 1A. The organic semiconductor material 156 may be selected from the same materials as those of the bottom-contact-type organic TFT of FIG. 1A. The organic semiconductor material 156 may be coated by a vacuum deposition process or an organic vapor deposition process. In this case, the organic semiconductor material 156 is coated at a degree of vacuum of $5\times10^{-4}$ Torr or less. Optionally, the organic semiconductor material 156 is coated at a degree of vacuum of $5\times10^{-7}$ Torr or less.

When the CNTs are vertically cultivated, they can have at least 10 to 100 times higher electron emission voltage and current density than silicon tips, diamond carbon thin layers, or carbon thin layers. Therefore, to vertically cultivate the CNTs, an activation process may be further carried out using an acid rinse or tape before the organic semiconductor material 156 is coated.

Thereafter, a passivation layer (not shown) may be further formed on the organic semiconductor layer 160 in order to protect the electric characteristics of the organic semiconductor layer 160. The passivation layer may be formed of silicon oxide or parylene (which is an abbreviation of poly(paraxylylene)) using a CVD process. In one embodiment, the passivation layer is formed of parylene having a thickness of 5 μm or less. The parylene is excellent in insulation, waterproofing, corrosion resistance, and chemical resistance. In addition to parylene, the passivation layer may be formed of one or more organic materials selected from the group consisting of polychloropyrene, polyethylene terephthalate (PET), polyoxymethylene, polyvinylchloride, polyfluorovinyliden (PVDF), cyanoethyl pullulan, polymethylmetaacrylate (PMMA), polysulfone, polycarbonate (PC), and polyimide. As a result, a bottom-contact-type organic TFT is completed.

In the illustrated embodiment, it is described that the organic TFT includes the organic semiconductor layer 160, which is formed by coating the organic semiconductor material 156 on the CNT layer 151. For brevity of explanation, only the bottom-contact-type organic TFT in which the organic semiconductor layer 160 is formed on the source and drain 140 and 145 is described. In certain embodiments, the organic semiconductor layer structure may apply to any other configurations of thin film transistors.

In another embodiment, the organic semiconductor layer configuration can apply to a top-contact-type organic TFT, as shown in FIG. 1D. In the top-contact-type organic TFT, an organic semiconductor layer 250 is interposed between a source/drain 260, 265 and a gate insulating layer 230. The organic semiconductor layer 250 further includes an organic semiconductor material layer 246 formed on a CNT layer 241, as illustrated in FIG. 1D. In this case, a substrate 200, a buffer layer 210, a gate electrode 220, a gate insulating layer 230, the organic semiconductor layer 250, the source 260, and the drain 265 are formed using the same material and method as the bottom-contact-type organic TFT of FIG. 1C.

As described above, the organic TFT may include a single-layered organic semiconductor layer which includes a mixture of CNTs and an organic semiconductor material. Alternatively, the organic semiconductor layer may have a double-layered structure, including a CNT layer and an organic semiconductor material layer coated on the CNT layer. In either case, the resulting organic semiconductor layer has a similar combination structure. Each of the CNTs and the organic semiconductor material has sufficient electrical characteristics to form an organic semiconductor layer. In the embodiments above, however, the CNTs and the organic semiconductor material complement each other, and thus provide an organic TFT having not only a charge mobility of 3.3 cm$^2$/V·sec or higher and an on/off ratio of 1×10$^9$ or higher but also a high switching speed.

The organic TFT according to the embodiments described above can be employed as a driving device for a variety of devices, such as electronic paper, liquid crystal displays (LCDs), organic light emitting displays (OLEDs), and solar batteries.

According to the embodiments as described above, an organic TFT includes an organic semiconductor layer, which is formed by mixing CNTs with an organic semiconductor material or coating the organic semiconductor material on a CNT layer. Properties of the organic semiconductor layer such as charge mobility and switching speed can be improved owing to the CNTs' high electric conductivity and charge mobility.

Although the present invention has been described with reference to certain exemplary embodiments thereof, changes may be made to the described embodiments without departing from the scope of the present invention.

What is claimed is:

1. An electronic device, comprising:
   a substrate; and
   a thin film transistor formed over the substrate, the thin film transistor comprising a channel, a gate electrode, an insulating layer, a source, and a drain, the insulating layer being interposed between the channel and the gate electrode,
   wherein the channel comprises a mixture of carbon nanotubes and an organic semiconductor material, and
   wherein the carbon nanotubes are distributed substantially throughout the channel.

2. The device of claim 1, wherein the electronic device comprises a display device.

3. The device of claim 1, wherein the carbon nanotubes and the organic semiconductor material are substantially homogeneously distributed throughout the channel.

4. The device of claim 1, wherein the carbon nanotubes and the organic semiconductor material are non-homogeneously distributed within the channel.

5. The device of claim 1, wherein the channel comprises a first layer comprising the carbon nanotubes, and a second layer comprising the organic semiconductor material.

6. The device of claim 5, wherein the second layer is interposed between the first layer and the insulating layer.

7. The device of claim 5, wherein the first layer is interposed between the second layer and the insulating layer.

8. The device of claim 5, wherein the first layer further comprises the organic semiconductor material.

9. The device of claim 5, wherein the second layer is substantially free of the carbon nanotubes.

10. The device of claim 9, wherein the second layer is thinner than about a half of the thickness of the first layer.

11. The device of claim 9, wherein the first layer is thinner than about a half of the thickness of the second layer.

12. The device of claim 5, wherein the first layer has a thickness of less than about 5 μm.

13. The device of claim 1, wherein the channel further comprises one or more materials selected from the group consisting of Au, Pt, Si, Ag, Fe, Ni, Co, and alloys comprising one or more of the foregoing elements.

14. The device of claim 1, wherein at least part of the carbon nanotubes are coated with one or more materials selected from the group consisting of Au, Pt, Si, Ag, Fe, Ni, Co, and alloys comprising one or more of the foregoing elements.

15. The device of claim 1, wherein the carbon nanotubes comprise at least one form selected from the group consisting of single-walled carbon nanotubes, multi-walled carbon nanotubes, and rope nanotubes.

16. The device of claim 1, wherein the carbon nanotubes comprise at least one structure selected from the group consisting of a zigzag structure, an armchair structure, and a chiral structure.

17. The device of claim 1, wherein the carbon nanotubes have a diameter about 200 nm or less.

18. The device of claim 1, wherein the organic semiconductor material comprises one or more compounds selected from the group consisting of pentacene, oligo-thiophene, poly(alkyl-thiophene), and poly(thienylencvinylene).

19. The device of claim 1, wherein the gate electrode is interposed between the insulating layer and the substrate, wherein a first portion of the insulating layer is interposed between the substrate and the source, wherein a second portion of the insulating layer is interposed between the substrate and the drain, wherein a third portion of the insulating layer is interposed between the gate electrode and the channel, and wherein both the source and the drain contact the channel.

20. The device of claim 1, wherein the channel has a charge mobility of greater than 3.3 cm$^2$/V·sec.

21. The device of claim 1, wherein the channel has an on/off ratio of greater than 1×10$^9$.

22. A method of making an electronic device, the method comprising:
   providing a substrate; and
   forming a thin film transistor over the substrate, the thin film transistor comprising a channel, a gate electrode, an insulating layer, a source, and a drain, the insulating layer being interposed between the channel and the gate electrode, the source and drain contacting the channel,
   wherein the channel comprises a mixture of carbon nanotubes and an organic semiconductor material, and
   wherein the carbon nanotubes are distributed substantially throughout the channel.

23. The method of claim 22, wherein the channel further comprises one or more materials selected from the group consisting of Au, Pt, Si, Ag, Fe, Ni, Co, and alloys comprising one or more of the foregoing elements.

24. The method of claim 22, wherein at least part of the carbon nanotubes are coated with one or more materials selected from the group consisting of Au, Pt, Si, Ag, Fe, Ni, Co, and alloys comprising one or more of the foregoing elements.

25. The method of claim 22, wherein the organic semiconductor material comprises one or more compounds selected from the group consisting of pentacene, oligo-thiophene, poly(alkyl-thiophene), and poly(thienylenevinylene).

26. The method of claim 22, forming the thin film transistor comprises:
   forming the channel, which comprises forming a first layer and a second layer, wherein the first layer comprises the carbon nanotubes, and wherein the second layer comprises the organic semiconductor material and is substantially free of the carbon nanotubes.

27. The method of claim 22, wherein forming the thin film transistor comprises forming the channel, and wherein forming the channel comprises using one process selected from the group consisting of spin coating, ink-jet printing, and screen printing.

28. The method of claim 27, wherein forming the channel further comprises sintering at a temperature about 300° C. or lower.

29. The method of claim 26, wherein forming the second layer comprises using a method selected from the group consisting of vacuum deposition and organic vapor deposition.

30. The method of claim 26, wherein forming the second layer is at least partially performed in a vacuum atmosphere of $5 \times 10^{-4}$ Torr or less.

31. A method of operating an electronic device, the method comprising:

providing the electronic device of claim 1; and stimulating the electronic device to activate the channel of the thin film transistor, wherein the channel has a charge mobility of greater than 3.3 cm$^2$/V·sec during the activation.

32. The method of claim 31, wherein the channel has an on/off ratio of greater than $1 \times 10^9$ during the activation.

* * * * *